United States Patent
Javorka et al.

(10) Patent No.: US 8,524,564 B2
(45) Date of Patent: Sep. 3, 2013

(54) FULL SILICIDATION PREVENTION VIA DUAL NICKEL DEPOSITION APPROACH

(75) Inventors: Peter Javorka, Radeburg (DE); Stefan Flachowsky, Dresden (DE); Thilo Scheiper, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 31 days.

(21) Appl. No.: 13/204,283

(22) Filed: Aug. 5, 2011

(65) Prior Publication Data

US 2013/0032901 A1 Feb. 7, 2013

(51) Int. Cl.
*H01L 31/119* (2006.01)
(52) U.S. Cl.
USPC ........... 438/296; 438/300; 438/592; 438/664; 257/338; 257/368; 257/369; 257/412; 257/E21.165; 257/E21.166; 257/E21.439; 257/E21.444
(58) Field of Classification Search
USPC .............. 438/296, 300, 592, 664; 257/338, 257/368, 369, 412, E21.165, E21.166, E21.439, 257/E21.444
See application file for complete search history.

(56) References Cited

U.S. PATENT DOCUMENTS

| | | | | |
|---|---|---|---|---|
| 6,455,383 | B1 * | 9/2002 | Wu | 438/296 |
| 2005/0269635 | A1 * | 12/2005 | Bojarczuk et al. | 257/338 |
| 2011/0211394 | A1 * | 9/2011 | Scheiper et al. | 365/185.18 |
| 2012/0235244 | A1 * | 9/2012 | Yin et al. | 257/368 |

* cited by examiner

*Primary Examiner* — Dao H Nguyen
(74) *Attorney, Agent, or Firm* — Ditthavong Mori & Steiner, P.C.

(57) ABSTRACT

Semiconductor devices are formed without full silicidation of the gates and with independent adjustment of silicides in the gates and source/drain regions. Embodiments include forming a gate on a substrate, forming a nitride cap on the gate, forming a source/drain region on each side of the gate, forming a first silicide in each source/drain region, removing the nitride cap subsequent to the formation of the first silicide, and forming a second silicide in the source/drain regions and in the gate, subsequent to removing the nitride cap. Embodiments include forming the first silicide by forming a first metal layer on the source/drain regions and performing a first RTA, and forming the second silicide by forming a second metal layer on the source/drain regions and on the gate and performing a second RTA.

14 Claims, 3 Drawing Sheets

FULL SILICIDATION PREVENTION VIA DUAL NICKEL DEPOSITION APPROACH

TECHNICAL FIELD

The present disclosure relates to silicidation of semiconductor gates and source/drain regions. The present disclosure is particularly applicable to semiconductor devices in 32 nanometer (nm) bulk and SOI, 22 nm bulk and SOI technology nodes, and beyond.

BACKGROUND

In the standard gate first high-k/metal gate (HKMG) process the thickness of the silicide in the gate and source/drain regions cannot be controlled separately. As a result, if the proper thickness is targeted in the source/drain regions, the gate may become fully silicided. A fully silicided gate can negatively affect performance of the device, for example, by generating a high long channel threshold voltage (Vt) variation, or affecting gate resistance-capacitance delay. Conversely, a reduction of silicide thickness in the gate will be accompanied by an insufficient silicide thickness in source/drain regions, which likewise can cause poor transistor performance.

A need therefore exists for methodology enabling adjustment of silicide thickness in the gate and source/drain regions independently, and the resulting product.

SUMMARY

An aspect of the present disclosure is a method of fabricating a semiconductor device, including forming a first silicide layer in the source/drain regions before removing a nitride cap from the gate, and forming a second silicide layer in the gate and source/drain regions after removing the nitride cap from the gate.

Another aspect of the present disclosure is a semiconductor device including a silicide in the source/drain regions having a thickness greater than a silicide in the gate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including: forming a gate on a substrate; forming a nitride cap on the gate; forming a source/drain region on each side of the gate; forming a first silicide in each source/drain region; removing the nitride cap subsequent to the formation of the first silicide; and forming a second silicide in the source/drain regions and in the gate, subsequent to removing the nitride cap.

Aspects of the present disclosure include forming the first silicide by forming a first metal layer on the source/drain regions and performing a first rapid thermal anneal (RTA); and forming the second silicide by forming a second metal layer on the source/drain regions and in the gate and performing a second RTA. Further aspects include forming the first metal layer to a first thickness and the second metal layer to a second thickness, the first thickness being 20% to 50% of the sum of the first and second thicknesses. Other aspects include forming the first and the second metal layers to a combined thickness of 200 nm to 400 nm. Another aspect includes forming the first silicide by performing the first RTA at a first temperature of 200° C. to 400° C. and the second RTA at a second temperature of 400° C. to 600° C. Additional aspects include forming the first silicide to a thickness of 10 nm to 20 nm in the source/drain regions and forming the second silicide to a thickness of 20 nm to 40 nm in source/drain regions and in the upper portion of the gate. Further aspects include removing the nitride cap by dry etching. Other aspects include forming halo/extension regions in the substrate on each side of the gate prior to removing the nitride cap. Additional aspects include forming the source/drain regions by growing embedded silicon germanium (eSiGe) in the substrate. Further aspects include forming the gate by forming a high-k/metal gate. Another aspect includes forming the second silicide in the top 10% to 30% of the gate. Other aspects include forming the first and the second metal layers including nickel or nickel alloy.

Another aspect of the present disclosure is a device including: a substrate; a gate formed on the substrate; a source/drain region in the substrate on each side of the gate; a first silicide formed in the upper portion of the gate, the first silicide having a first thickness; and a second silicide in each source/drain region, the second silicide having a second thickness greater than the first thickness.

Aspects include a device having first and second silicides, with first and second thicknesses, respectively, wherein the first thickness is 10% to 30% of the second thickness. Further aspects include a device, wherein the source/drain regions include embedded silicon germanium (eSiGe). Another aspect includes a device, wherein the gate includes a high-k/metal gate. Other aspects include a device, wherein the first silicide is formed in the upper 10% to 30% of the gate. Additional aspects include a device, wherein the first and the second silicides include nickel silicide (NiSi).

Another aspect of the present disclosure is a method including: forming a high-k/metal gate on a substrate; forming a nitride cap on the gate; forming an embedded silicon germanium (eSiGe) source/drain region on each side of the gate; forming halo/extension regions in the substrate on each side of the gate; depositing a first layer including nickel (Ni) or Ni alloy on the source/drain regions; performing a first rapid thermal anneal (RTA) at a temperature of 200° C. to 400° C., to form a first silicide; removing the nitride cap by dry etching subsequent to the first RTA; depositing a second layer including Ni or Ni alloy on the source/drain regions and on the gate, subsequent to removing the nitride cap; performing a second RTA at a temperature of 400° C. to 600° C., to form a second silicide, wherein a thickness of the first layer including Ni or Ni alloy is 20% to 50% of a combined thickness of the first and the second layers including Ni or Ni alloy, and the combined thickness of the layers including Ni or Ni alloy is 10 nm to 40 nm. Another aspect includes forming the second silicide in the top 10% to 30% of the gate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompa- FIGS. 1A through 1E schematically illustrate a process flow for silicidation in a semiconductor device, in accordance with an exemplary embodiment.

DETAILED DESCRIPTION

Figure 1A:
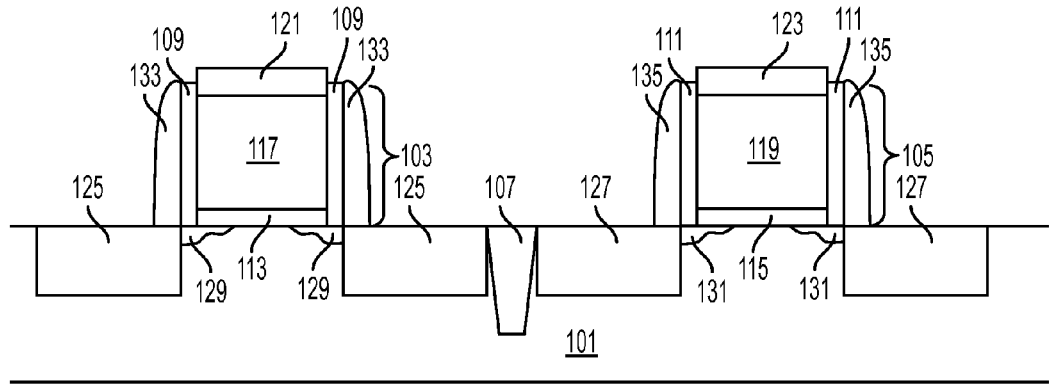

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a full silicidation of the gates attendant upon silicidation of source/drain regions and gates in a gate first HKMG process. The fully silicided gate in turn can negatively affect performance of the device, for example, influencing high long channel Vt variation or gate resistance-capacitance delay. In accordance with embodiments of the present disclosure a two-stage silicidation is employed, taking advantage of the nitride cap on the gate for protecting the gate during formation of the source/drain regions. The first metal layer is deposited on the source/drain regions, while the nitride cap remains on the gate, while the second metal layer is deposited on both the gate and the source/drain regions after removal of the nitride cap. A thermal treatment is used after each metal deposition to form silicides. The two-stage silicidation provides independent control over the thicknesses of silicides in the gate and source/drain regions.

Methodology in accordance with embodiments of the present disclosure includes forming a gate on a substrate, forming a nitride cap on the gate, forming a source/drain region on each side of the gate, forming a first silicide in each source/drain region, removing the nitride cap subsequent to the formation of the first silicide, and forming a second silicide in the source/drain regions and in the gate, subsequent to removing the nitride cap.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1E schematically illustrate a process flow for a two-stage silicidation, in accordance with an exemplary embodiment. Adverting to FIG. 1A, gates 103 and 105, of a p-type and an n-type transistor, respectively, are formed by conventional methods on a substrate 101. Gates 103 and 105 may be, for example, high-k/metal gates formed by a gate first approach. Nitride caps 121 and 123, for example, including SiN, are formed on gates 103 and 105, respectively. Shallow trench isolation (STI) region 107 is formed in substrate 101, to electrically isolate the p-type transistor from the n-type transistor. After gates 103 and 105 are etched, differential spacers 109 and 111 are formed on both sides of gates 103 and 105, respectively. Spacers may comprise nitride, for example silicon nitride (SiN), and are formed by conventional methods. Gates 103 and 105 may include high-k gate dielectric layers 113 and 115, respectively, at the gate to substrate interface. Gate dielectric layers 113 and 115 may include, for example, hafnium (HO, zirconium (Zr), or titanium (Ti) oxides. Gates 103 and 105 may further include gate electrodes 117 and 119, respectively, formed on dielectric layers 113 and 115, to a thickness of 10 Å. Gate electrodes 117 and 119 may include a metal portion, which may include, for example, tantalum (Ta), tungsten (W), tantalum nitride (TaN), or titanium nitride (TiN), and may be formed to a thickness of 1 Å to 10 Å. Gate electrodes 117 and 119 may further include a portion of polysilicon, formed to a thickness of 400 Å to 600 Å, on top of the metal portion. Source/drain regions 125, which may be formed by growing embedded SiGe (eSiGe), are formed in substrate 101 on each side of gate 103, by conventional methods. In addition, source/drain regions 127 may be formed on each side of gate 105, by conventional methods. Halo/extension regions 129 and 131 may be formed in substrate 101 on each side of gates 103 and 105, respectively, for example by implantation of arsenic (As) or boron (B). Second spacers 133 and 135 may be formed on spacers 109 and 111 respectively, by conventional methods.

Figure 1B:
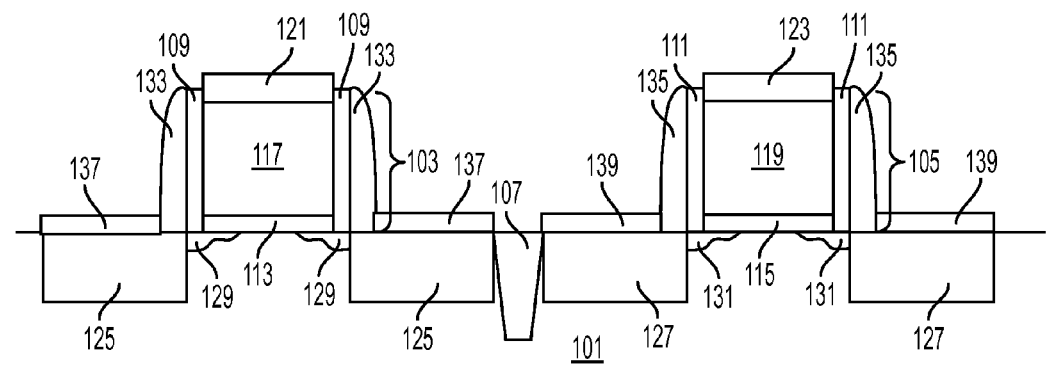

As illustrated in FIG. 1B, first metal layers 137 and 139 are formed on source/drain regions 125 and 127, respectively, by deposition, for example, sputter deposition. First metal layers 137 and 139 may include nickel (Ni) or nickel alloy, for example a nickel/platinum alloy, and are formed to a thickness of 50 nm to 200 nm.

Figure 1C:
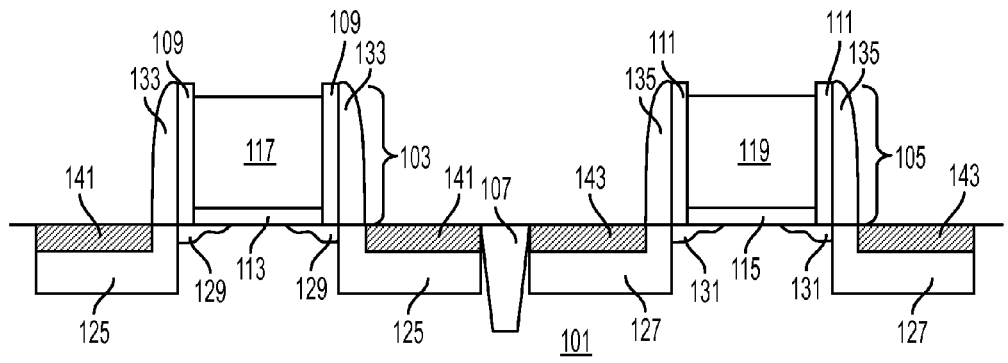

Adverting to FIG. 1C a first RTA is performed to form first silicides 141 and 143, on each side of gates 103 and 105, respectively. First silicides 141 and 143 may have a thickness of 50 nm to 100 nm. The first RTA may be performed at a temperature of 400° C. to 600° C., for 5 to 40 seconds. Subsequently, nitride caps 121 and 123 are removed from gates 103 and 105, for example by etching, e.g., using dry etching, for example reactive ion etching (RIE).

Figure 1D:
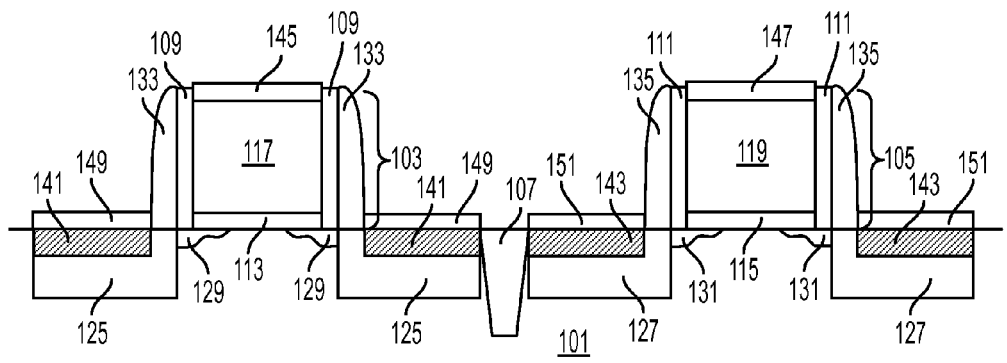

As illustrated in FIG. 1D, second metal layers 145 and 147 are deposited on gates 103 and 105, respectively, and second metal layers 149 and 151 are deposited on source/drain regions 125 and 127. Second metal layers 149 and 151 are deposited to a thickness which may be 20% to 50%, for example 50%, of the sum of the thicknesses of first metal layers 137 and 139 and second metal layers 149 and 151, respectively. The combined thicknesses of the first and second metal layers 137 and 139 may be 100 nm to 300 nm, for example 160 nm.

Figure 1E:
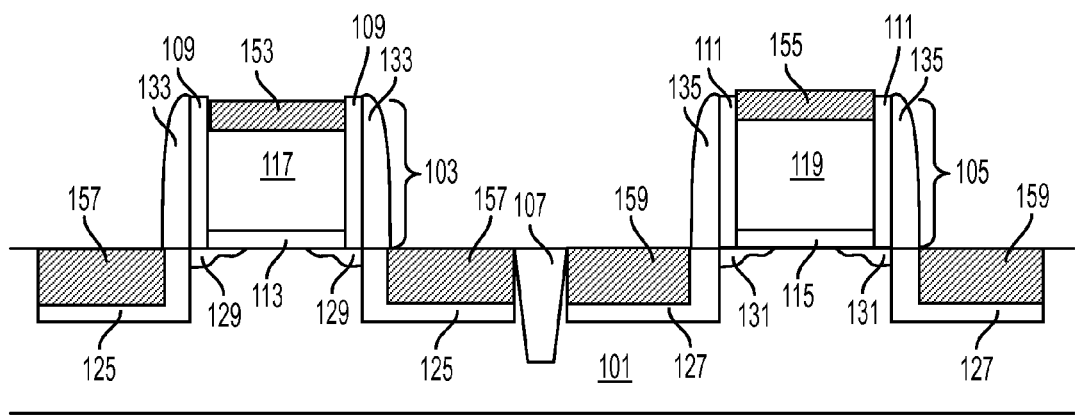

Adverting to FIG. 1E, following deposition of second metal layers 149 and 151, a second RTA may be performed at a temperature of 400° C. to 600° C., for 5 to 40 seconds. The second RTA forms second silicides 153 and 155 in the upper portions of gates 103 and 105, respectively. Second silicides (not shown for illustrative convenience) are also formed in source/drain regions 125 and 127, which combined with first silicides 141 and 144, respectively, form combined source/drain silicides 157 and 159 to a thickness of 100 nm to 300 nm. Second silicides 153 and 155 may be formed in the top 10% to 30% of gates 103 and 105, and their thickness may be 20% to 50% of the thicknesses of combined source/drain silicides 157 and 159.

The embodiments of the present disclosure can achieve several technical effects, including the ability to adjust the thicknesses in the gates and source/drain regions independently, and therefore the elimination of full silicidation of the gates without compromising the silicide thickness in the source/drain regions, and consequently improvement of transistor performance. The present disclosure enjoys industrial applicability in any of various types of highly integrated semiconductor technologies, particularly in 32 nm bulk and SOI and 22 nm bulk and SOI technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a gate on a substrate;
    forming a nitride cap on the gate;
    forming a source/drain region on each side of the gate;
    forming a first silicide in each source/drain region;
    removing the nitride cap subsequent to the formation of the first silicide; and
    forming a second silicide in the source/drain regions and in the gate, subsequent to removing the nitride cap,
    wherein, after forming the second silicide, silicide formed in the source/drain regions has a thickness that is greater than silicide formed in the gate.

2. The method according to claim 1, comprising:
    forming the first silicide by forming a first metal layer on the source/drain regions and performing a first rapid thermal anneal (RTA); and
    forming the second silicide by forming a second metal layer on the source/drain regions and in the gate and performing a second RTA.

3. The method according to claim 2, comprising forming the first metal layer to a first thickness and the second metal layer to a second thickness, the first thickness being 20% to 50% of the sum of the first and second thicknesses.

4. The method according to claim 3, comprising forming the first and the second metal layers to a combined thickness of 100 nanometers (nm) to 300 nm.

5. The method according to claim 4, comprising forming the first silicide by performing the first RTA at a first temperature of 200° C. to 400° C. and the second RTA at a second temperature of 400° C. to 600° C.

6. The method according to claim 5, comprising forming the first silicide to a thickness of 50 nm to 200 nm in the source/drain regions and forming the second silicide to a thickness of 100 nm to 300 nm in source/drain regions and in the upper portion of the gate.

7. The method according to claim 6, comprising removing the nitride cap by dry etching.

8. The method according to claim 7, comprising forming halo/extension regions in the substrate on each side of the gate prior to removing the nitride cap.

9. The method according to claim 8, comprising forming the source/drain regions by growing embedded silicon germanium (eSiGe) in the substrate.

10. The method according to claim 9, comprising forming the gate by forming a high-k/metal gate, and comprising forming the first and the second metal layers including nickel (Ni) or Ni alloy.

11. The method according to claim 1, comprising forming the second silicide in only the top 5% to 30% of the gate.

12. The method according to claim 1, wherein the gate is not fully silicided by the formation of the second silicide.

13. A method comprising:
    forming a high-k/metal gate on a substrate;
    forming a nitride cap on the gate;
    forming an embedded silicon germanium (eSiGe) source/drain region on each side of the gate;
    forming halo/extension regions in the substrate on each side of the gate;
    depositing a first layer including nickel (Ni) or Ni alloy on the source/drain regions;
    performing a first rapid thermal anneal (RTA) at a temperature of 200° C. to 400° C., to form a first silicide;
    removing the nitride cap by dry etching subsequent to the first RTA;
    depositing a second layer including Ni or Ni alloy on the source/drain regions and on the gate, subsequent to removing the nitride cap;
    performing a second RTA at a temperature of 400° C. to 600° C., to form a second silicide,
    wherein a thickness of the first layer including Ni or Ni alloy is 20% to 50% of a combined thickness of the first and the second layers including Ni or Ni alloy, and the combined thickness of the layers including Ni or Ni alloy is 100 nm to 300 nm, and
    wherein, after performing the second RTA, silicide formed in the source/drain regions has a thickness that is greater than silicide formed in the gate.

14. The method according to claim 13, comprising forming the second silicide in only the top 5% to 30% of the gate.

* * * * *